(12) United States Patent
Choi et al.

(10) Patent No.: US 9,671,461 B2
(45) Date of Patent: Jun. 6, 2017

(54) TEST SYSTEM FOR SEMICONDUCTOR APPARATUS AND TEST METHOD USING THE SAME

(71) Applicant: SK hynix Inc., Gyeonggi-do (KR)

(72) Inventors: Boung Ii Choi, Gyeonggi-do (KR); Dae Hee Lee, Gyeonggi-do (KR); Ki Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 13 days.

(21) Appl. No.: 14/856,171

(22) Filed: Sep. 16, 2015

(65) Prior Publication Data

US 2016/0131710 A1 May 12, 2016

(30) Foreign Application Priority Data

Nov. 10, 2014 (KR) .................. 10-2014-0155292

(51) Int. Cl.
*G01R 35/00* (2006.01)
*G01R 31/317* (2006.01)
*G01R 31/319* (2006.01)

(52) U.S. Cl.
CPC ... *G01R 31/31725* (2013.01); *G01R 31/3191* (2013.01); *G01R 35/005* (2013.01)

(58) Field of Classification Search
CPC .......... G01R 31/3191; G01R 31/31937; G01R 31/3016; H03L 7/07; G01S 7/006; G01D 4/002
USPC ........ 324/601, 600, 750.02, 500, 130, 76.11, 324/527–555, 76.28, 76.31, 76.44, 324/750.28, 762.01
See application file for complete search history.

(56) References Cited

U.S. PATENT DOCUMENTS

2003/0030453 A1\* 2/2003 Mayder ................ G01R 31/319
324/750.02

FOREIGN PATENT DOCUMENTS

KR 100864633 10/2008

\* cited by examiner

*Primary Examiner* — Melissa Koval
*Assistant Examiner* — Trung Nguyen
(74) *Attorney, Agent, or Firm* — IP & T Group LLP

(57) ABSTRACT

A test system for a semiconductor apparatus that includes a calibration board having first skew information therein and outputting a plurality of test signals, and a main board configured to perform first skew correction for correcting skews of the test signals based on the first skew information and perform secondary skew correction for correcting an I/O skew thereof using the plurality of test signals.

15 Claims, 2 Drawing Sheets

TEST SYSTEM FOR SEMICONDUCTOR APPARATUS AND TEST METHOD USING THE SAME

CROSS-REFERENCES TO RELATED APPLICATION

This application claims priority under 35 U.S.C. 119(a) to Korean application No. 10-2014-0155292, filed on Nov. 10, 2014, in the Korean intellectual property Office, which is incorporated by reference in its entirety as set forth in full.

BACKGROUND

1. Technical Field

The inventive concept relates to a semiconductor apparatus, and more particularly, to a test system for a semiconductor apparatus and a test method of the semiconductor apparatus using the same.

2. Related Art

Application-specific integrated circuits (ASICs) are ICs designed and customized for specific functions of systems or electric appliances employing the same.

ASICs may be installed or embedded in a main board to be used in such systems.

A test operation has to be performed t check whether the ASICs operate properly.

FIG. 1 is a view illustrating a configuration of a conventional test system for a semiconductor apparatus. As illustrated in FIG. 1, a test system 1 may include a main board 10 where the ASIC to be tested is installed and a calibration board 20.

The calibration board 20 is configured for probing tests of the ASIC.

Input/output (I/O) terminals of the main board 10 and the calibration board 20 may be coupled through a connector 30.

In the conventional test method, signals are supplied to the calibration board 20 from the main board 10 through the I/O terminals.

Subsequently, probing points corresponding to the I/O terminals of the calibration board 20 are sequentially probed using a probe needle 50.

The test operation may be completed by measuring skews of signal timings at the probing points corresponding to the I/O terminals through the above-described process and correcting skews of signal timings at the I/O terminals based on the measured skew values.

However, since the skews of the signal timings are measured and corrected using the probe needle 50, the testing takes a considerable amount of time.

In addition, since expensive equipment such as robots and probing systems for robot control are used to move the probe needle 50, testing costs are increase.

SUMMARY

One or more exemplary embodiments are provided for a test system of a semiconductor apparatus and a test method of the semiconductor apparatus using the same, which are capable of reducing time and costs for testing the semiconductor apparatus.

An embodiment provides a test system for a semiconductor apparatus. The test system may include a calibration board having first skew information therein and suitable for outputting a plurality of test signals, and a main board suitable for performing first skew correction for correcting skews of the test signals based on the first skew information and performing secondary skew correction for correcting input/output (I/O) skews thereof using the plurality of test signals.

The first skew information may include skew information of the plurality of test signals detected through a test of the calibration board.

Another embodiment includes test method of a semiconductor apparatus. The test method may include mounting a calibration board on a main board, performing first skew correction by reading out first skew information of the calibration board in the main board, and performing secondary skew correction by measuring skews of input/output (I/O) terminals of the main board based on a plurality of test signals provided from the calibration board to the main board.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
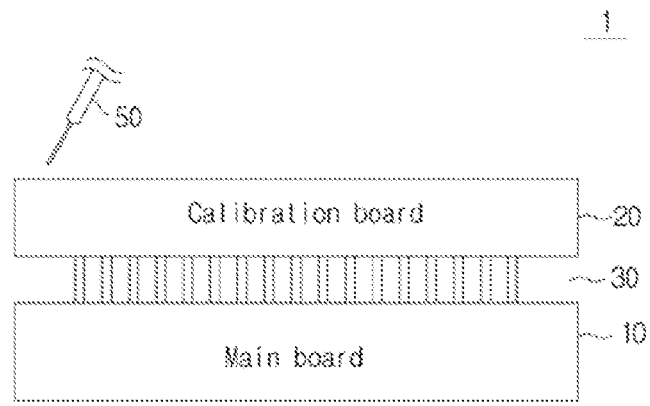
FIG. 1 is a view illustrating a configuration of a conventional test system for a semiconductor apparatus.

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes illustrated herein but may be to include deviations in shapes that result, for example, from manufacturing. In the drawings, lengths and sizes of layers and regions may be exaggerated for clarity. Like reference numerals in the drawings denote like elements. It is also to be understood that when a layer is referred to as being "on" another layer or substrate, it can be directly on the other or substrate, or intervening layers may also be present.

The inventive concept is described herein with reference to cross-section and/or plan illustrations of idealized embodiments of the inventive concept. However, embodiments of the inventive concept should not be construed as limiting the inventive concept. Although a few embodiments of the inventive concept will be shown and described, it will be appreciated by those of ordinary skill in the art that changes may be made in these exemplary embodiments without departing from the principles and spirit of the inventive concept.

Figure 2:
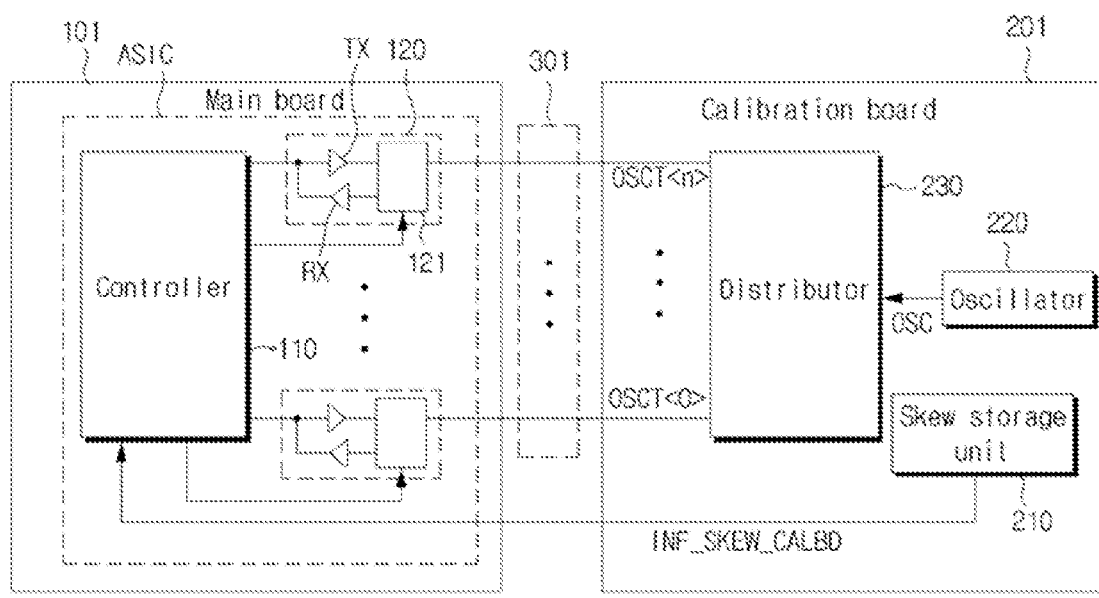
FIG. 2 is a view illustrating a configuration of a test system for a semiconductor apparatus according to an embodiment of the inventive concept.

FIG. 2 is a view illustrating a configuration of a test system for a semiconductor apparatus according to an embodiment of the inventive concept. As illustrated in FIG.

2, a test system 100 for a semiconductor apparatus according to an embodiment of the inventive concept may include a main board 101 and a calibration board 201.

I/O terminals 301 of the main board 101 and the calibration board 201 may be coupled through a connector (not shown).

The calibration board 201 may be configured to store first skew information INF_SKEW_CALBD therein, and provide a plurality of test signals OSCT<0:n>.

The first skew information INF_SKEW_CALBD may be I/O skew information of the calibration board 201.

The main board 101 may be configured to perform first skew correction based on the first skew information INF_SKEW_CALBD, and perform secondary skew correction using the plurality of test signals OSCT<0:n>.

The calibration board 201 may include a skew storage unit 210, an oscillator 220, and a distributor 230.

The skew storage unit 210 may be configured to store skew information of an output signal detected through a test of the calibration board 201 as the first skew information INF_SKEW_CALBD.

The skew storage unit 210 may include a nonvolatile memory, for example, an electrically erasable programmable read only memory (EEPROM).

The oscillator 220 may be configured to generate an oscillation signal OSC having a certain period.

The distributor 230 may be configured to duplicate the oscillation signal OSC by the number of I/O terminals and output the duplicate oscillation signals as the plurality of test signals OSCT<0:n>.

The main board 101 may include an ASIC, and the ASIC may include a controller 110, and a plurality of receiving/transmitting units 120.

The plurality of transmitting/receiving units 120 may be configured to receive the plurality of test signals OSCT<0:n>, and controlled to perform the skew correction by an external device, that is, the controller 110.

The plurality of transmitting/receiving units 120 may be configured to perform the skew correction by adjusting the delay time of an input/output signal.

The plurality of transmitting/receiving units 120 may be configured to output signals of the ASIC to the outside (e.g. to an external device) of the main board 101.

The controller 110 may be configured to read out the first skew information INF_SKEW_CALBD from the skew storage unit 210 of the calibration board 201 and control the plurality of transmitting/receiving units 120 to perform the first skew correction based on the first skew information INF_SKEW_CALBD.

The controller 110 may be configured to detect skews of the I/O terminals 301 based on the plurality of test signals OSCT<0:n> provided from the calibration board 201, and control the plurality of transmitting/receiving units 120 to perform the secondary skew correction based on the detected skews.

Each of the plurality of transmitting/receiving units 120 may include a transmitter TX, a receiver RX, and a skew adjustment unit 121.

The transmitter TX may be configured to output the signals of the ASIC to the output of the main board 101 through an output signal path.

The receiver RX may be configured to receive the plurality of test signals OSCT<0:n> provided from the calibration board 201 through and input signal path and transmit the plurality of received test signals OSCT<0:n> to the controller 110.

The skew adjustment unit 121 may be configured to adjust a delay time of the output signal path of the transmitter TX and/or a delay time of the input signal path of the receiver RX under control of the controller 110.

Figure 3:
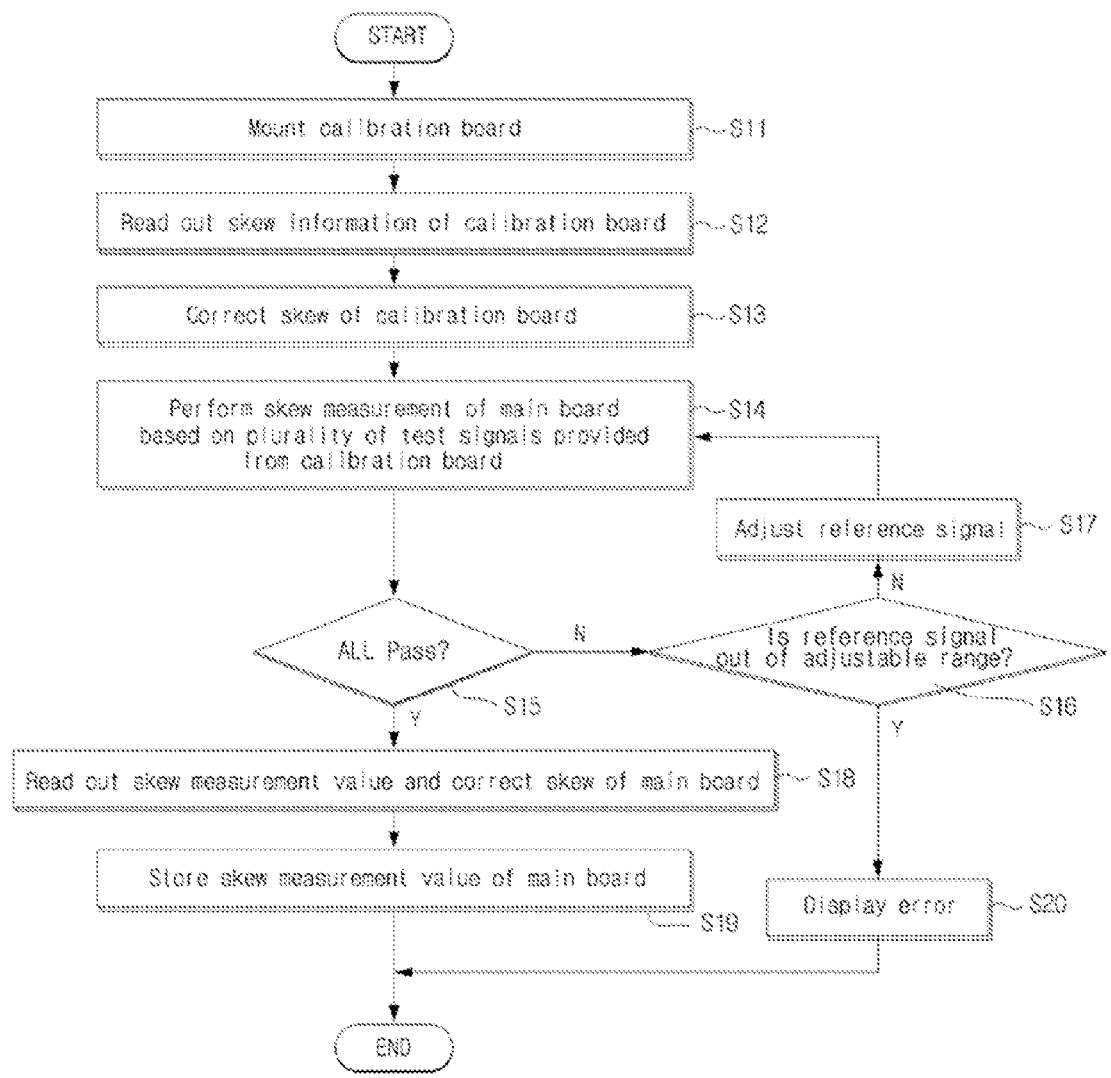
FIG. 3 is a flowchart illustrating a test method of a semiconductor apparatus according to an embodiment of the inventive concept.

Hereinafter, a test method of a semiconductor apparatus in the test system 100 according to an embodiment of the inventive concept will be described with reference to FIGS. 2 and 3. FIG. 3 is a flowchart illustrating the test method of the semiconductor apparatus according to an embodiment of the inventive concept.

The calibration board 201 is mounted on the main board 101 (S11).

In advance, the calibration board 201 may be tested to measure a skew of its output signal as the first skew information INF_SKEW_CALBD and store the first skew information INF_SKEW_CALBD in the skew storage unit 210 therein.

Ideally, the output signal of the calibration board 201, that is, the plurality of test signals OSCT<0:n> have to be inputted to the main board 110 with the same timing.

However, skew may exist in the plurality of test signals OSCT<0:n> due to physical characteristics, signal line characteristics, and the like of the calibration board 201.

Therefore, the skew of the output signal of the calibration board 201 is measured through the test and the measured skew of the output signal of the calibration board 201 is stored in the skew storage unit 210 as the first skew information INF_SKEW_CALBD.

The controller 110 of the main board 101 reads out the first skew information INF_SKEW_CALBD from the skew storage unit 210 of the calibration board 201 (S12).

The controller 110 of the main board 101 performs a first skew correction operation which corrects the skew of the calibration board 201 by adjusting a delay time of the skew adjustment unit 121 based on the first skew information INF_SKEW_CABLD (S13).

The skews of the plurality of test signals OSCT<0:n> may be corrected through the above-described first skew correction operation, and the plurality of test signals OSCT<0:n> may be inputted to the receivers RX of the plurality of transmitting/receiving units 120 with the same timing.

The controller 110 of the main board 101 may perform an ASIC skew measurement operation based on the plurality of test signals OSCT<0:n> provided from the calibration board 201 (S14).

The controller 110 may use any one of the plurality of test signals OSCT<0:n>, for example, the test signal OSCT<0> as a reference signal.

The controller 110 may perform the ASIC skew measurement operation in such a manner as to compare timings of other test signals with a timing of the reference signal OSCT<0>.

The controller 110 determines whether all the test signals OSCT<0:n> are passed, that is, all skew values of the plurality of test signals OSCT<0:n> are within a setting range based on the skew measurement result (S15).

It may be determined whether all the skew values of the plurality of test signals OSCT<0:n> are within the setting range based on whether other test signals OSCT<1:n> have the same logic value on the basis of the reference signal OSCT<0>.

When all the test signals OSCT<0:n> are not passed as a determination result in operation S15, it is determined whether the reference signal OSCT<0> is out of an adjustable range (S16).

When the reference signal OSCT<0> is not out of the adjustable range as a determination result in operation S16, the controller 110 may adjust the timing of the reference signal OSCT<0> (S17).

After adjusting the timing of the reference signal OSCT<0>, the controller may measuring the skews of the test signals and determine again whether all the test signals OSCT<0:n> are passed. The controller 110 may control the other test signals OSCT<1:n> among the plurality of test signals OSCT<0:n> to satisfy a path condition by repeating operations S14 to S17.

When all the test signals OSCT<0:n> are passed as a determination result in operation S15, the controller 110 may perform a secondary skew correction operation which corrects the skew of the main board 101 by adjusting a delay time of the skew adjustment unit 121 based on the corresponding skew measurement value (S18).

After the secondary skew correction operation is performed, the controller 110 may store the corresponding skew measurement value in a file form, (S19).

When the reference signal OSCT<0> is out of the adjustable range as the determination result in the operation S16, the controller 110 may display a skew correction error (S20).

The reference signal out of the adjustable range may mean that one skew value or more are not corrected among the test signals OSCT<1:n> due to physical circuit defects and the like even when the timing adjustment value of the reference signal OSC<0> up to a previous stage reaches a maximum value or a minimum value.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A test system for a semiconductor apparatus comprising:
    a calibration board storing first skew information and outputting a plurality of test signals; and
    a main board suitable for performing first skew correction for correcting skews of the test signals based on the first skew information stored in the calibration board and performing secondary skew correction for correcting input/output (I/O) skews thereof using the plurality of test signals,
    wherein the first skew information includes skew information of the plurality of test signals detected through a test of the calibration board.

2. The test system of claim 1, wherein the calibration board includes:
    a skew storage unit suitable for storing the first skew information;
    an oscillator suitable for generating an oscillation signal having a set period; and
    a distributor suitable for duplicating the oscillation signal by a number of output terminals and outputting the duplicated oscillation signals as the plurality of test signals.

3. The test system of claim 2, wherein the skew storage unit includes a nonvolatile memory.

4. The test system of claim 1, wherein the main board includes an application specific integrated circuit (ASIC), and the ASIC includes:
    a controller suitable for reading out the first skew information from the calibration board, and controlling the first skew correction and the secondary skew correction based on the read first skew information and the plurality of test signals; and
    a plurality of transmitting/receiving units suitable for transmitting the plurality of test signals from the calibration board to the controller and performing the first and secondary skew corrections under control of the controller.

5. The test system of claim 4, wherein the plurality of transmitting/receiving units are suitable for performing the first skew correction and the secondary skew correction by adjusting a delay time of an input signal.

6. The test system of claim 4, wherein each of the plurality transmitting/receiving units includes:
    a transmitter suitable for outputting a signal of the ASIC to the outside of the main board;
    a receiver suitable for receiving the plurality of test signals and transmitting the plurality of received test signals to the controller; and
    a skew adjustment unit suitable for adjusting a delay time of a signal path of the transmitter and/or a signal path of the receiver under the control of the controller.

7. The test system of claim 4, wherein the controller reads out the first skew information from the calibration board and controls the plurality of transmitting/receiving units to perform the first skew correction based on the first skew information, and
    the controller detects skews of I/O terminals based on the plurality of test signals and controls the plurality of transmitting/receiving units to perform the secondary skew correction corresponding to the detected skews.

8. A test method of a semiconductor apparatus, the test method comprising:
    mounting a calibration board on a main board;
    performing first skew correction by reading out first skew information which is stored in the calibration board from the main board; and
    performing secondary skew correction by measuring skews of input/output (I/O) terminals of the main board based on the plurality of test signals provided from the calibration board to the main board,
    wherein the first skew information includes skew information of the plurality of test signals detected through a test of the calibration board.

9. The test method of claim 8, wherein the performing of the first skew correction includes:
    adjusting a delay time of an input signal path of the main board based on the first skew information.

10. The test method of claim 8, wherein the performing of the secondary skew correction includes:
    generating an oscillation signal in the calibration board; and
    generating the plurality of test signals through duplication of the oscillation signal in the calibration board.

11. The test method of claim 8, wherein the performing of the secondary skew correction includes:
    measuring skews of other test signals using any one of the plurality of test signals as a reference signal; and
    adjusting a delay time of an input signal path based on the measured skews.

12. The test method of claim 8, wherein the performing of the secondary skew correction further includes:
    storing values of the measured skews as the skews of the I/O terminals of the main board in a file form.

13. The test method of claim 12, wherein the measuring of the skews of the other test signals includes:
   determining whether the other test signals have the same logic value on a basis of the reference signal; and
   adjusting a timing of the reference signal when the other test signals are not the same logic value.

14. The test method of claim 13, wherein the measuring of the skews of the other test signals includes:
   repeating the determining of the other test signals and the adjusting of timing of the reference signal until the other test signals have the same logic value.

15. The test method of claim 8, wherein skews of the plurality of test signals are corrected through the first skew correction, and the skews of input/output (I/O) terminals of the main board are corrected through the secondary skew correction.

* * * * *

UNITED STATES PATENT AND TRADEMARK OFFICE
CERTIFICATE OF CORRECTION

PATENT NO. : 9,671,461 B2  
APPLICATION NO. : 14/856171  
DATED : June 6, 2017  
INVENTOR(S) : Boung Il Choi et al.

Page 1 of 1

It is certified that error appears in the above-identified patent and that said Letters Patent is hereby corrected as shown below:

On the Title Page

Item [72], should read:  
Boung Il Choi, Gyeonggi-do, (KR);  
Dae Hee Lee, Gyeonggi-do, (KR);  
Ki Hyun Kim, Gyeonggi-do, (KR)

Signed and Sealed this  
Twenty-third Day of March, 2021

Drew Hirshfeld  
*Performing the Functions and Duties of the*  
*Under Secretary of Commerce for Intellectual Property and*  
*Director of the United States Patent and Trademark Office*